United States Patent
Choi et al.

(12) 
(10) Patent No.: US 6,751,134 B2
(45) Date of Patent: Jun. 15, 2004

(54) INTERNAL VOLTAGE GENERATING APPARATUS FOR A SEMICONDUCTOR MEMORY DEVICE

(75) Inventors: Jun Gi Choi, Seoul (KR); Tae Yun Kim, Chungcheongbuk-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/330,887

(22) Filed: Dec. 27, 2002

(65) Prior Publication Data

US 2003/0179618 A1 Sep. 25, 2003

(30) Foreign Application Priority Data

Mar. 25, 2002 (KR) ................. 10-2002-0016093

(51) Int. Cl.⁷ ................................... G11C 7/00
(52) U.S. Cl. .................. 365/189.11; 365/201
(58) Field of Search .............. 365/189.11, 201

(56) References Cited

U.S. PATENT DOCUMENTS 6,684,173 B2 * 1/2004 Kessenich et al. .......... 702/117
6,690,603 B2 * 2/2004 Matsubara et al. ..... 365/185.33

* cited by examiner

Primary Examiner—M. Tran
(74) Attorney, Agent, or Firm—Marshall, Gerstein & Borun LLP

(57) ABSTRACT

An internal voltage generating apparatus for a semiconductor memory device is described herein. The internal voltage generating apparatus is configured to execute an internal voltage margin test with a small number of pads by installing a forcing pad and fuse (or switch) in an initial reference voltage generating terminal during a multi-chip product test of the DRAM to cut down expenses, and to overcome load or noise due to the forcing pad by cutting (switching off) the fuse after a wafer level test during a normal operation.

17 Claims, 5 Drawing Sheets

INTERNAL VOLTAGE GENERATING APPARATUS FOR A SEMICONDUCTOR MEMORY DEVICE

TECHNICAL FIELD

The present disclosure relates generally to semiconductor memory devices, and more particularly, to an internal voltage generating apparatus for a semiconductor memory device.

BACKGROUND

According to high integration of the DRAM, a number of net dies per wafer must be maximized. Thus, an area allocated as a peri region in each die is gradually decreased. When the area of the peri region is decreased, it is difficult to use general pads in the narrow die. Even if a number of the pads used in the peri region is decreased, a multi-chip product test of the DRAM must be normally executed.

In addition, expenses are increased because of an increased time required for testing products, and a number of test items that cannot be tested by a specific equipment is increased because of deterioration of the equipment. To solve the foregoing problems, the test time may be reduced by using the multi-chip test technique that increases a number of dies which can be tested at a time.

FIG. 1 is a block diagram illustrating a conventional internal voltage generating apparatus for executing the multi-chip test. The conventional internal voltage generating apparatus includes a reference voltage generator 1, a core voltage amplifying unit 2, a peri voltage amplifying unit 3, a core voltage driver 4, a peri voltage driver 5, a core voltage pad 6, a peri voltage pad 7, a core reference voltage pad 9 and a peri reference voltage pad 10. Here, an amplifier A1 of the core voltage amplifying unit 2 receives an initial reference voltage VR0 from the reference voltage generator 1 through its positive (+) terminal. The amplifier A1, which has its negative (−) terminal connected to a common node of resistors R2C and R1C, outputs a core reference voltage VREFC through its output terminal. An amplifier A2 of the peri voltage amplifying unit 3 receives the initial reference voltage VR0 from the reference voltage generator 1 through its positive (+) terminal. The amplifier A2, which has its negative (−) terminal connected to a common node of resistors R2P and R1P, outputs a peri reference voltage VREFP through its output terminal.

The core voltage driver 4 drives the core reference voltage VREFC from the core voltage amplifying unit 2 and outputs a core voltage VCORE to a core unit of a cell and peri unit 8. The peri voltage driver 5 drives the peri reference voltage VPERI from the peri voltage amplifying unit 3 and outputs the peri voltage VPERI to a peri unit of the cell and peri unit 8. The core voltage pad 6 is connected to an output terminal of the core voltage driver 4 and outputs a core voltage for forcing the core voltage VCORE. The peri voltage pad 7 is connected to an output terminal of the peri voltage driver 5 and outputs a peri voltage for forcing the peri voltage VPERI.

The core voltage and the peri voltage are forced by the core voltage pad 6 and the peri voltage pad 7. As a result, one can test the operation of the cell and peri unit 8 in response to variation of internal voltages as one method for testing device property on completed wafers. That is, the device property test can be executed by forcing levels of the core voltage VCORE being internally-generated for a DRAM core region and the peri voltage VPERI being internally-generated for a DRAM peri region. In the device property test, an internal voltage margin is checked by increasing or decreasing the level of the core voltage VCORE or the peri voltage VPERI.

In the case of the aforementioned multi-chip test, 8, 16 or more devices are tested at the same time. Here, a current driving unit of the test equipment for forcing the core voltage VCORE and the peri voltage VPERI cannot handle current consumption of 8, 16, or more devices. Accordingly, the core reference voltage pad 9 for forcing the level of the core reference voltage VREFC is additionally provided in input terminal of the core voltage driver 4 in the chip, and the peri reference voltage pad 10 for forcing the level of the peri reference voltage VREFP is additionally provided in input terminal of the peri voltage driver 5.

In the conventional internal voltage generating apparatus, however, the core reference voltage pad 9 and the peri reference voltage pad 10 become loads of the core reference voltage VREFC and the peri reference voltage VREFP in a normal operation. In addition, wires connected to the core reference voltage pad 9 and the peri reference voltage pad 10 are exposed to external noise, which may change the levels of the core reference voltage VREFC and the peri reference voltage VREFP.

SUMMARY OF THE DISCLOSURE

An internal voltage generating apparatus for a semiconductor device is described herein. The disclosed apparatus is configured to execute an internal voltage margin test with a small number of pads by installing a forcing pad and fuse (or switch) in an initial reference voltage generating terminal during a multi-chip product test of the DRAM for cutting down expenses. Further, the disclosed apparatus is configured to overcome load or noise due to a pad during a normal operation by cutting (switching off) a fuse after a wafer level test.

In particular, the internal voltage generating apparatus for a semiconductor memory device includes a reference voltage generator configured to generate an initial reference voltage, an internal voltage supply circuit configured to generate a core voltage and a peri voltage by using the initial reference voltage, and a forcing circuit configured to force different level voltages for a test. The forcing circuit includes an initial reference voltage pad connected to an output terminal of the reference voltage generator to output a forced initial reference voltage for test, a core voltage pad connected to a core voltage output terminal of the internal voltage supply circuit to output a forced core voltage for a test, and a peri voltage pad connected to a peri voltage output terminal of the internal voltage supply circuit to output a forced peri voltage for a test.

BRIEF DESCRIPTION OF THE DRAWINGS

The disclosure will be described in terms of several embodiments to illustrate its broad teachings. Reference is also made to the attached drawings.

DETAILED DESCRIPTION

Figure 1:
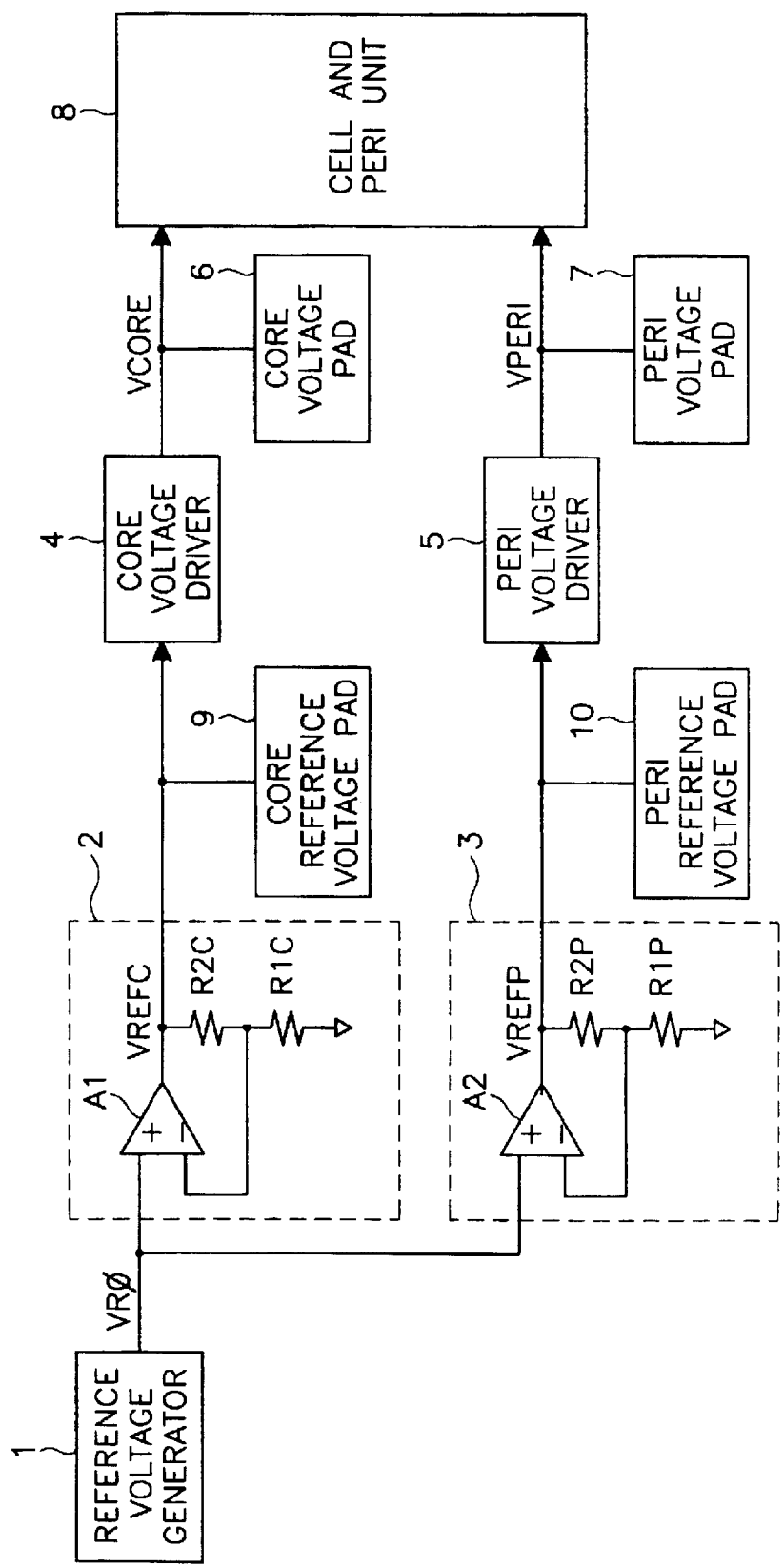
FIG. 1 is a block diagram of a conventional internal voltage generating apparatus.
Figure 2:
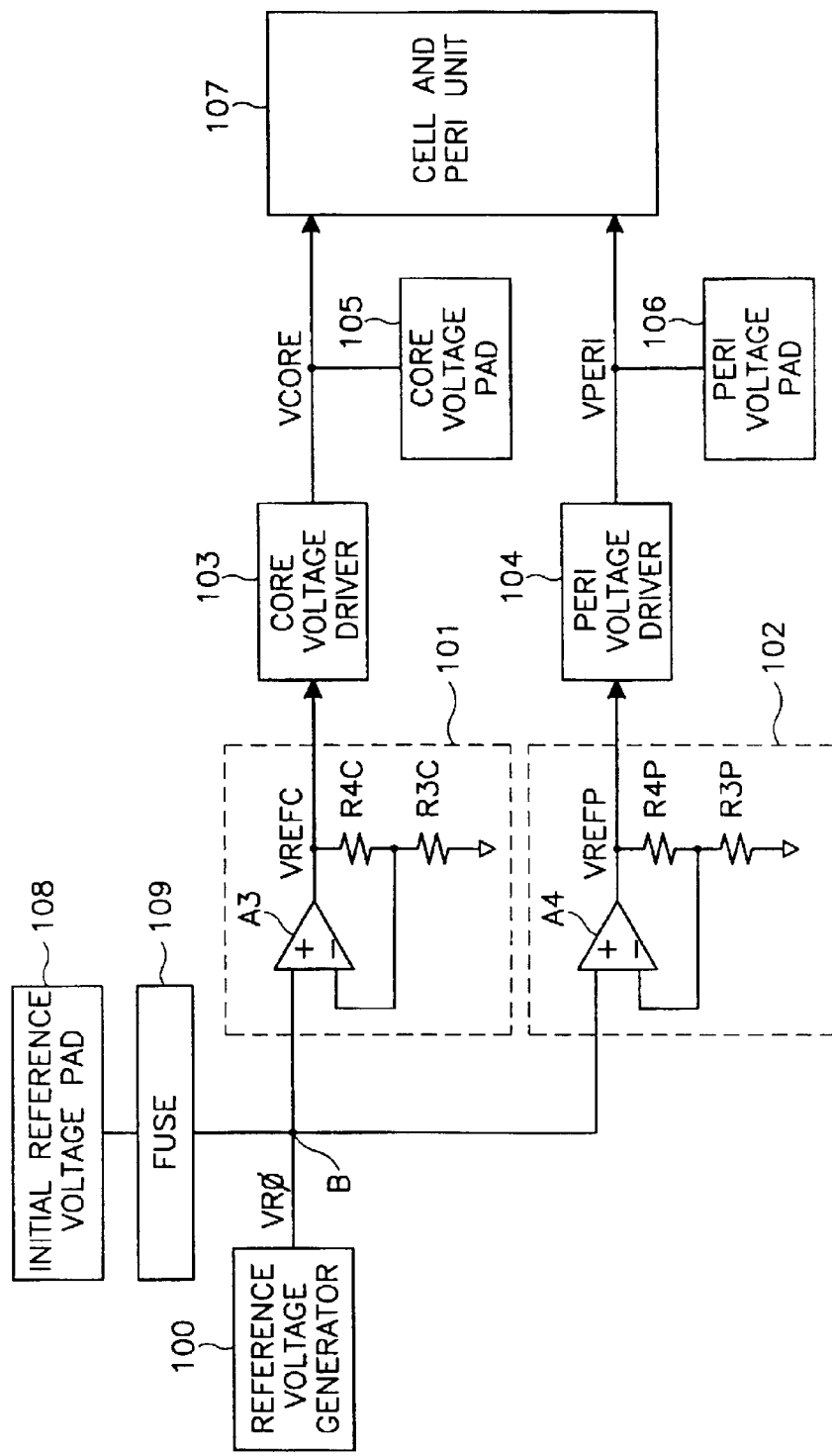
FIGS. 2, 3, 4, and 5 are block diagrams of an internal voltage generating apparatus for a semiconductor memory device.

An internal voltage generating apparatus for a semiconductor memory device will be described in detail with reference to the accompanying drawings. In particular, FIG. 2 is a block diagram of an internal voltage generating apparatus for a semiconductor memory device. Referring to FIG. 2, the internal voltage generating apparatus includes a reference voltage generator 100, an internal voltage supply circuit and a forcing circuit. Here, the internal voltage supply circuit includes a core voltage amplifying unit 101, a peri voltage amplifying unit 102, a core voltage driver 103, and a peri voltage driver 104. The forcing circuit includes a core voltage pad 105, a peri voltage pad 106, an initial reference voltage pad 108, and a fuse 109.

The reference voltage generator 100 may generate an initial reference voltage VR0, which must maintain a stable level. The reference voltage generator 100 is composed of a current mirror circuit for minimizing changes of the level caused by temperature variations.

An amplifier A3 of the core voltage amplifying unit 101 receives the initial reference voltage VR0 from the reference voltage generator 100 through its positive (+) terminal. The amplifier A3, which has its negative (−) terminal connected to a common node of resistors R3C and R4C, outputs a core reference voltage VREFC through its output terminal. An amplifier A4 of the peri voltage amplifying unit 102 receives the initial reference voltage VR0 from the reference voltage generator 100 through its positive (+) terminal. The amplifier A4, which has its negative (−) terminal connected to a common node of resistors R3P and R4P, outputs a peri reference voltage VREFP through its output terminal.

The core voltage driver 103 drives the core reference voltage VREFC from the core voltage amplifying unit 101, and outputs a core voltage VCORE to a cell and peri unit 107. The peri voltage driver 104 drives a peri reference voltage VREFP from the peri voltage amplifying unit 102, and outputs a peri voltage VPERI to the cell and peri unit 107. The core voltage pad 105 is connected to an output terminal of the core voltage driver 103, and the peri voltage pad 106 is connected to an output terminal of the peri voltage driver 104. The core voltage pad 105 is configured to measure and to force a level of the core voltage VCORE during the measurement of one die. The peri voltage pad 106 is configured to measure and to force a level of the peri voltage VPERI during the measurement of one die.

In addition, the initial reference voltage pad 108 and the fuse 109 are connected to an output side node B of the reference voltage generator 100. That is, the core reference voltage VREFC and the peri reference voltage VREFP can be generated by connecting the initial reference voltage pad 108 to the node B, which is a terminal for generating the initial reference voltage VR0. However, the initial reference voltage pad 108 may be operated as load in a normal operation, and connection wires thereof may be exposed to noise. To solve the foregoing problems, the fuse 109 is positioned between the initial reference voltage pad 108 and the node B. The fuse 109 is cut at the same time as a fuse cutting time for trimming internal voltage levels of each die in a wafer level. Thus, the internal voltage generating apparatus is configured to overcome load and noise caused by the initial reference voltage pad 108.

When the reference voltage generator 100 generates the initial reference voltage VR0, an initial reference voltage for a test is outputted through the initial reference voltage pad 108 to force the initial reference voltage VR0. Here, the fuse 109 maintains a connection state to connect the initial reference voltage pad 108 and the node B. The core voltage amplifying unit 101 receives the initial reference voltage VR0 and determines the level of the core reference voltage VREFC according to a ratio of the resistors R3C/R4C. In addition, the peri voltage amplifying unit 102 receives the initial reference voltage VR0 and determines the level of the peri reference voltage VREFP according to a ratio of the resistors R3P/R4P.

Here, the core voltage amplifying unit 101 and the peri voltage amplifying unit 102 drive the level of the reference voltage (1+R4/R3) times as much as the level of the initial reference voltage VR0. The ratio of the resistors is designed to be controlled by a plurality of fuses. That is, when the measurement of each internal voltage level on the wafer is finished, the level of the internal voltage is trimmed approximately to the internal voltage that is set up as a target value through the fuses.

The core reference voltage VREFC is transmitted from the core voltage amplifying unit 101 to the core voltage driver 103, and the peri reference voltage VREFP is transmitted from the peri voltage amplifying unit 102 to the peri voltage driver 104. When the core voltage driver 103 generates the core voltage VCORE, a core voltage for a test is outputted through the core voltage pad 105 to force the core voltage VCORE. When the peri voltage driver 104 generates the peri voltage VPERI, a peri voltage for a test is outputted through the peri voltage pad 106 to force the peri voltage VPERI.

Thereafter, the core voltage driver 103 improves current supply capability of the core reference voltage VREFC from the core voltage amplifying unit 101, and outputs the core voltage VCORE to a core unit of the cell and peri unit 107. In addition, the peri voltage driver 104 improves current supply capability of the peri reference voltage VREFP from the peri voltage amplifying unit 102, and outputs the peri voltage VPERI to a peri unit of the cell and peri unit 107.

The core voltage driver 103 and the peri voltage driver 104 have a standby mode and an active mode to be operated according to an operation mode of the DRAM. The fuse 109 is cut at the same time as the fuse cutting time for trimming the internal voltage levels of each die in the wafer level. Thus, it is possible to decrease a number of necessary forcing pads and to overcome load and noise caused by connection wires of the initial reference voltage pad 108.

Figure 3:
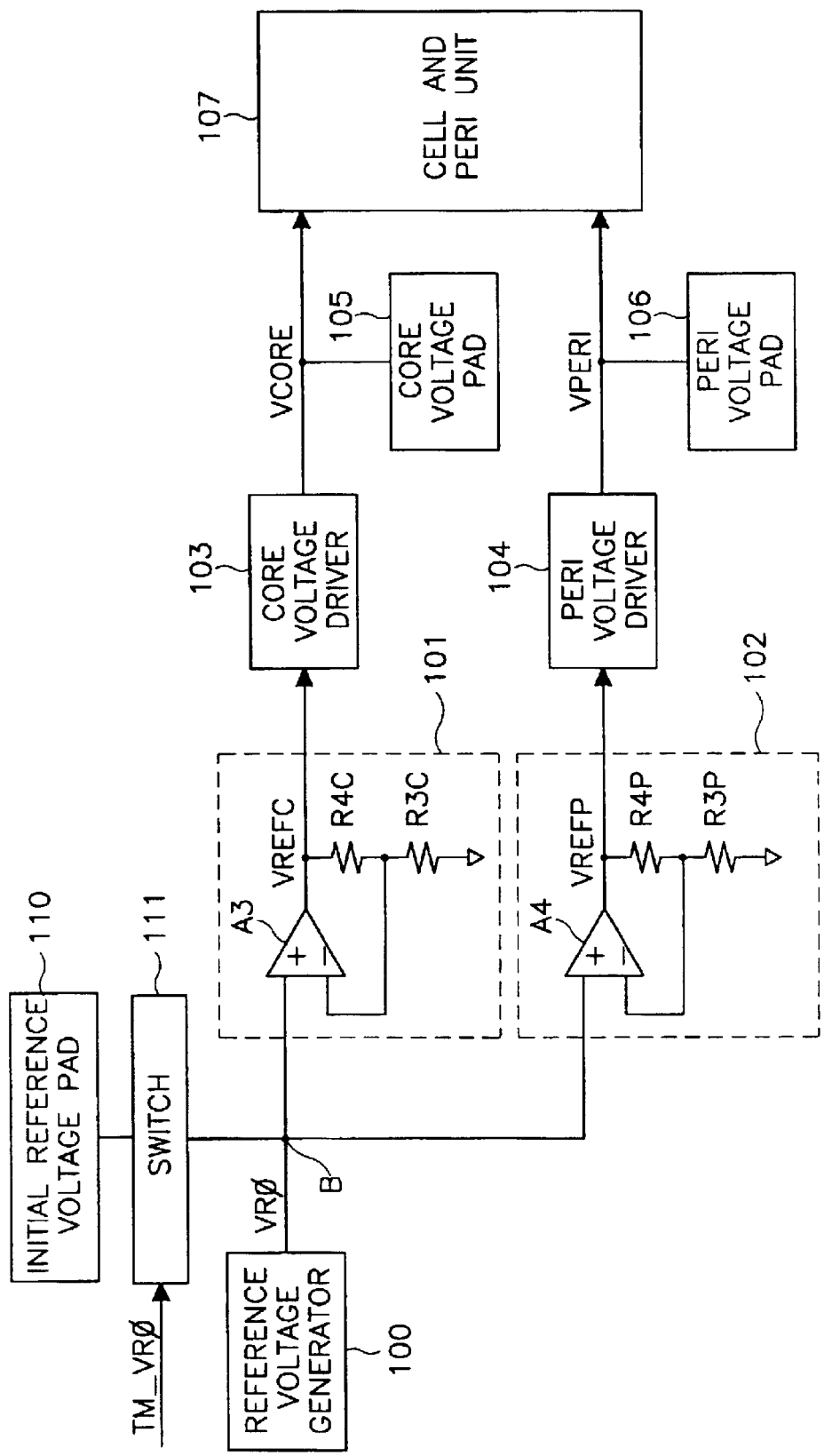

FIG. 3 is also a block diagram of an internal voltage generating apparatus for a semiconductor memory device. Same drawing reference numerals are used for the same elements in FIGS. 2 and 3. Referring to FIG. 3, the internal voltage generating apparatus further includes an initial reference voltage pad 110 and a switch 111 in input terminal of the node B.

For example, the switch 111 is composed of an NMOS transistor, and a PMOS transistor or a transmission gate. The switch 111 may be triggered under the control of a test mode signal TM_VR0. In a voltage forcing test of a wafer level, the switch 111 is switched on according to the test mode signal TM_VR0 to transmit the output from the initial reference voltage pad 110 to the node B. In a normal operation, the switch 111 is switched off under the control of the test mode signal TM_VR0. As a result, it is possible to decrease a number of necessary forcing pads and to overcome load and noise caused by connection wires of the initial reference voltage pad 110.

Figure 4:
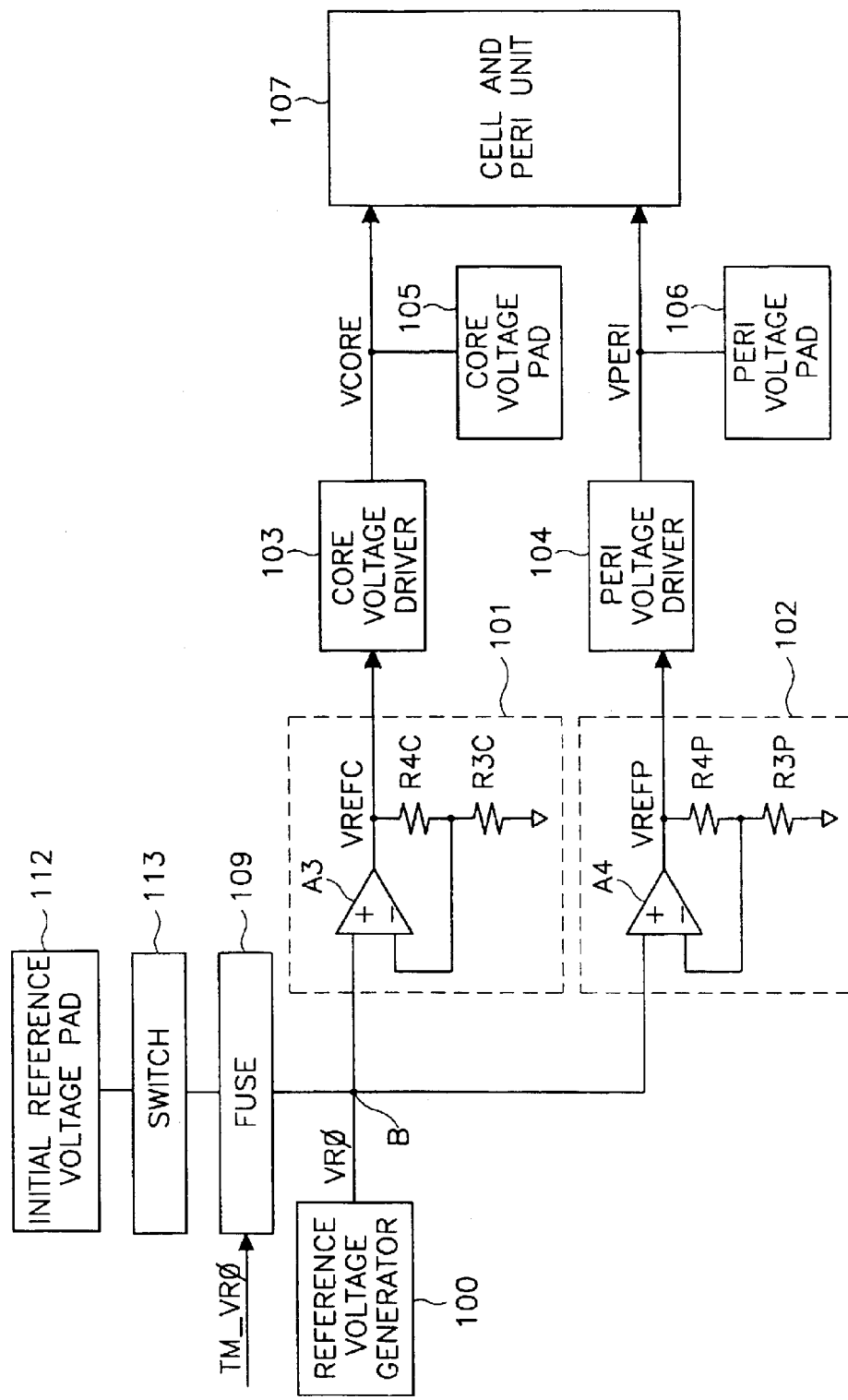

FIG. 4 is another block diagram of an internal voltage generating apparatus for a semiconductor memory device. Same drawing reference numerals are used for the same elements in FIGS. 2 and 4. As illustrated in FIG. 4, the internal voltage generating apparatus further includes an initial reference voltage pad 112, a switch 113, and a fuse 109 in an input terminal of the node B, the core voltage amplifying unit 101, and the peri voltage amplifying unit 102.

For example, the switch 113 is composed of an NMOS transistor, and a PMOS transistor or a transmission gate. The switch 113 is triggered according to a test mode signal TM_VR0. In a voltage forcing test of a wafer level, the switch 113 is switched on and the fuse 114 is connected according to the test mode signal TM_VR0 to transmit the output from the initial reference voltage pad 110 to the node B. In a normal operation, the switch 113 is switched off and the fuse 114 is disconnected according to the test mode signal TM_VR0. As a result, it is possible to decrease a number of necessary forcing pads and to overcome load and noise caused by connection wires of the initial reference voltage pad 110 with the selective operation of the switch 113 and the fuse 114.

Figure 5:
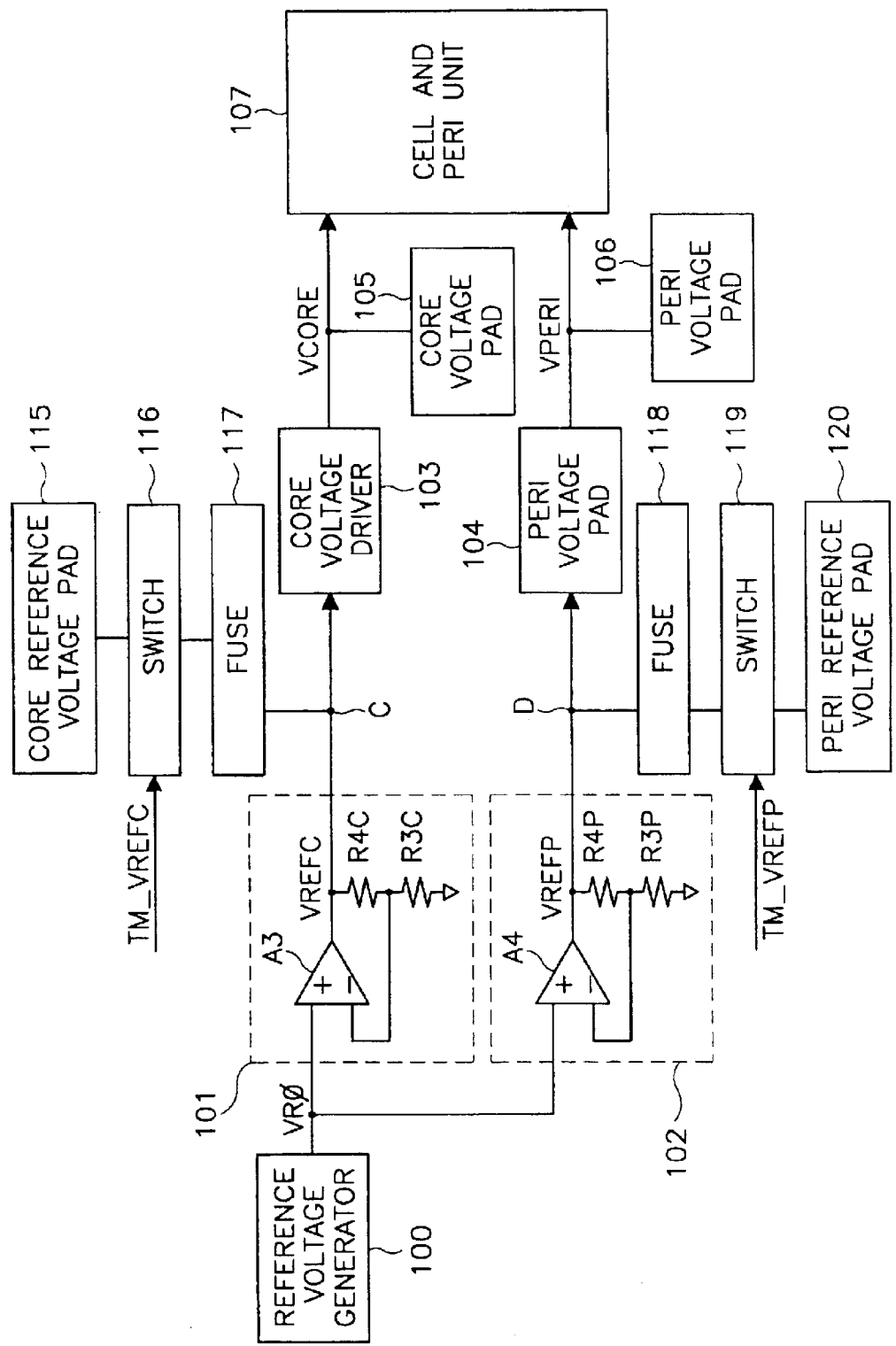

FIG. 5 is yet another block diagram of an internal voltage generating apparatus for a semiconductor memory device. Same drawing reference numerals are used for the same elements in FIGS. 2 and 5. As depicted in FIG. 5, the internal voltage generating apparatus includes a reference voltage generator 100, an amplifying circuit, a voltage driving circuit, a core reference voltage pad 115, a peri reference voltage pad 120, a pad unit and a switching circuit.

Here, the amplifying circuit includes a core voltage amplifying unit 101 and a peri voltage amplifying unit 102. The voltage driving circuit includes a core voltage driver 103 and a peri voltage driver 104. The pad unit includes a core voltage pad 105 and a peri voltage pad 106. Further, the switching circuit includes the switches 116 and 119 and the fuses 117 and 118. However, the user can selectively use the switches 116 and 119 and the fuses 117 and 118.

The core reference voltage pad 115, a switch 116, and a fuse 117 are connected to a node C, which is an output terminal of the core voltage amplifying unit 101. The peri reference voltage pad 120, a switch 119, and a fuse 118 are connected to a node D, which is an output terminal of the peri voltage amplifying unit 102. The switch 116 is composed of an NMOS transistor, and a PMOS transistor or a transmission gate. Further, the switch 116 is triggered according to a test mode signal TM_VREFC.

Accordingly, in a voltage forcing test of a wafer level, the switch 116 is switched on and the fuse 117 is connected according to the test mode signal TM_VREFC to transmit a core reference voltage for a test, which is the output from the core reference voltage pad 115 to the node C. In a normal operation, the switch 116 is switched off and the fuse 117 is disconnected according to the test mode signal TM_VREFC.

In addition, in the voltage forcing test of the wafer level, the switch 119 is switched on and the fuse 118 is connected according to a test mode signal TM_VREFP to transmit a peri reference voltage for a test which is the output from the peri reference voltage pad 120 to the node D. In a normal operation, the switch 119 is switched off and the fuse 118 is disconnected according to the test mode signal TM_VREFP. As a result, it is possible to overcome load and noise caused by connection wires of the core reference voltage pad 115 and the peri reference voltage pad 120 by the selective operation of the switches 116 and 119 and the fuses 117 and 118 in a package level test.

As discussed earlier, the disclosed internal voltage generating apparatus may decrease the number of the pads required for the multi-chip product test to reduce expenses. Moreover, the disclosed apparatus may stably perform the normal operation by forming the pads within a predetermined range to be aligned in the peri region and by separating input signals without performing a boding process in packaging. In addition, the fuse is cut (switched off) after the wafer level test to overcome load and noise caused by the corresponding pad in the succeeding normal operation.

Many changes and modifications to the embodiments described herein could be made. The scope of some changes is discussed above. The scope of others will become apparent from the appended claims.

What is claimed is:

1. An internal voltage generating apparatus for a semiconductor memory device, the apparatus comprising:
  a reference voltage generator configured to generate an initial reference voltage;
  an internal voltage supply generator configured to generate a core voltage and a peri voltage by using the initial reference voltage; and
  a forcing circuit configured to force different level voltages for a test,
  wherein the forcing circuit comprises:
    an initial reference voltage pad connected to an output terminal of the reference voltage generator, the initial reference voltage pad configured to output a forced initial reference voltage for the test;
    a core voltage pad connected to a core voltage output terminal of the internal voltage supply generator, the core voltage pad configured to output a forced core voltage for the test; and
    a peri voltage pad connected to a peri voltage output terminal of the internal voltage supply circuit, the peri voltage pad configured to output a forced peri voltage for the test.

2. The apparatus according to claim 1 further comprising a switching circuit positioned between the initial reference voltage pad and an output terminal of the reference voltage generator, wherein the switching circuit is configured to selectively connect or to disconnect the initial reference voltage pad and the output terminal.

3. The apparatus according to claim 2, wherein the switching circuit comprises a fuse configured to selectively intercept the output from the initial reference voltage pad.

4. The apparatus according to claim 2, wherein the switching circuit comprises a switching device configured to switch on when the initial reference voltage is forced, and to switch off in a normal operation according to an input state of a test mode signal.

5. The apparatus according to claim 4, wherein the switching circuit further comprises a fuse configured to disconnect when the switching device is switched off.

6. The apparatus according to claim 1, wherein the internal voltage supply generator comprises:
  a core voltage amplifying unit configured to amplify the initial reference voltage and to output a core reference voltage;
  a peri voltage amplifying unit configured to amplify the initial reference voltage and to output a peri reference voltage;
  a core voltage driver configured to drive the core reference voltage and to output the core voltage; and
  a peri voltage driver configured to drive the peri reference voltage and to output the peri voltage.

7. The apparatus according to claim 6, wherein the core voltage amplifying unit comprises:
  an amplifier configured to amplify the initial reference voltage; and a first resistor and a second resistor configured to control a level of the core reference voltage from the amplifier.

8. The apparatus according to claim 7, wherein the amplifier is configured to receive the initial reference voltage through its positive terminal with its negative terminal connected to a common node of the first resistor and the second resistor, and to output the core reference voltage through its output terminal.

9. The apparatus according to claim 6, wherein the peri voltage amplifying unit comprises:
   an amplifier configured to amplify the initial reference voltage; and
   a first resistor and a second resistor configured to control a level of the peri reference voltage from the amplifier.

10. The apparatus according to claim 9, wherein the amplifier is configured to receive the initial reference voltage through its positive terminal with its negative terminal connected to a common node of the first resistor and the second resistor, and to output the peri reference voltage through its output terminal.

11. An internal voltage generating apparatus for a semiconductor memory device, the apparatus comprising:
   an amplifying circuit configured to amplify an initial reference voltage, and to output a core reference voltage and a peri reference voltage;
   a voltage driving circuit configured to drive the core reference voltage and the peri reference voltage, and to output a core voltage and a peri voltage;
   a core reference voltage pad configured to output a forced core reference voltage for a test of a core reference voltage output terminal of the amplifying circuit;
   a peri reference voltage pad configured to output a forced peri reference voltage for a test of a peri reference voltage output terminal of the amplifying circuit;
   a pad unit configured to output the forced core voltage for a test and the forced peri voltage for a test to an output terminal of the voltage driving circuit;
   a first switching device configured to selectively intercept the output from the core reference voltage pad according to an input state of a test mode signal; and
   a second switching device configured to selectively intercept the output from the peri reference voltage pad according to the input state of the test mode signal.

12. The apparatus according to claim 11 further comprising:
   a first fuse configured to disconnect when the first switching device is switched off; and
   a second fuse configured to disconnect when the second switching device is switched off.

13. The apparatus according to claim 11, wherein the amplifying circuit comprises:
   a core voltage amplifying unit configured to amplify the initial reference voltage and to output the core reference voltage; and
   a peri voltage amplifying unit configured to amplify the initial reference voltage, and to output the peri reference voltage.

14. The apparatus according to claim 13, wherein the core voltage amplifying unit comprises:
   an amplifier configured to amplify the initial reference voltage; and
   a first resistor and a second resistor configured to control a level of the core reference voltage from the amplifier.

15. The apparatus according to claim 14, wherein the amplifier is configured to receive the initial reference voltage through its positive terminal with its negative terminal connected to a common node of the first resistor and the second resistor, and to output the core reference voltage through its output terminal.

16. The apparatus according to claim 13, wherein the peri voltage amplifying unit comprises:
   an amplifier configured to amplify the initial reference voltage; and
   a first resistor and a second resistor configured to control a level of the peri reference voltage from the amplifier.

17. The apparatus according to claim 16, wherein the amplifier is configured to receive the initial reference voltage through its positive terminal with its negative terminal connected to a common node of the first resistor and the second resistor, and to output the peri reference voltage through its output terminal.

\* \* \* \* \*